United States Patent
Wang et al.

(10) Patent No.: US 6,168,972 B1
(45) Date of Patent: Jan. 2, 2001

(54) FLIP CHIP PRE-ASSEMBLY UNDERFILL PROCESS

(75) Inventors: Wen-chou Vincent Wang, Cupertino; Michael G. Peters, Santa Clara; Dashun S. Zhou, Sunnyvale; Yasuhito Takahashi, San Jose, all of CA (US)

(73) Assignee: Fujitsu Limited (JP)

( * ) Notice: Under 35 U.S.C. 154(b), the term of this patent shall be extended for 0 days.

(21) Appl. No.: 09/218,781

(22) Filed: Dec. 22, 1998

(51) Int. Cl.$^7$ .................................................. H01L 21/48
(52) U.S. Cl. ........................ 438/108; 438/107; 438/106; 438/29; 438/156
(58) Field of Search .................................. 438/108, 107, 438/106, 29, 156

(56) References Cited

U.S. PATENT DOCUMENTS

| | | | |
|---|---|---|---|
| 4,676,868 | 6/1987 | Riley et al. ........................... | 156/643 |
| 5,030,799 | 7/1991 | Fukuta ................................. | 174/250 |
| 5,218,234 | 6/1993 | Thompson et al. .................. | 257/787 |
| 5,355,580 | 10/1994 | Tsukada ............................... | 29/840 |
| 5,442,240 | 8/1995 | Mukerji ............................... | 257/783 |
| 5,488,200 | * 1/1996 | Tsukada ............................... | 174/261 |
| 5,543,585 | 8/1996 | Booth et al. ........................ | 174/261 |
| 5,600,180 | 2/1997 | Kusaka et al. ...................... | 257/692 |
| 5,621,225 | 4/1997 | Shieh et al. ......................... | 257/81 |
| 5,641,946 | 6/1997 | Shim ................................... | 174/261 |
| 5,650,667 | 7/1997 | Liou .................................... | 270/780 |
| 5,659,203 | 8/1997 | Call et al. ........................... | 257/778 |
| 5,703,406 | 12/1997 | Kang ................................... | 257/778 |
| 5,704,116 | 1/1998 | Gamota et al. ..................... | 29/840 |
| 5,710,071 | 1/1998 | Beddingfield et al. ............. | 438/108 |
| 5,751,553 | * 5/1998 | Clayton .............................. | 361/749 |
| 5,956,605 | * 9/1999 | Akram et al. ...................... | 438/613 |
| 6,022,761 | * 2/2000 | Grupen-Shemanski et al. .... | 438/125 |

FOREIGN PATENT DOCUMENTS

| | | |
|---|---|---|
| 58-048947 | 3/1983 | (JP) . |
| 62-147735 | 7/1987 | (JP) . |
| 4-180244 | 6/1992 | (JP) . |
| 8-316257 | 11/1996 | (JP) . |

OTHER PUBLICATIONS

D. Zoba and M.E.Edwards, "Review of Underfill Encapsulant Development and Performance of Flip Chip Developments," ISHM 1995 proceedings, pp. 354–358.

C.P. Wong, S.H. Shi, and G. Jefferson, High Performance No Flow Underfills for Low–Cost Flip–Chip Applications, 1997 Electronic Components and Technology Conference, pp. 850–858.

* cited by examiner

Primary Examiner—Matthew Smith
Assistant Examiner—Granvill Lee
(74) Attorney, Agent, or Firm—Coudert Brothers

(57) ABSTRACT

An encapsulation process for flip-chip bonding chips to a substrate encapsulates solder balls on the chip in a separate encapsulation process in which the chip is coated with encapsulation layer and then a portion of the encapsulation layer is removed to expose a portion of the solder balls.

20 Claims, 6 Drawing Sheets

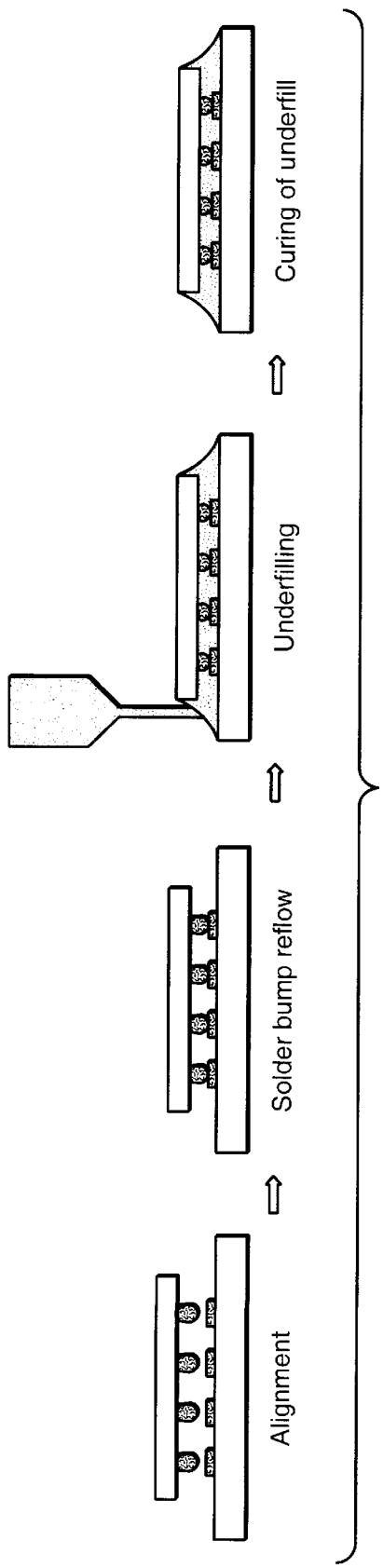
FIG._1 *(PRIOR ART)*
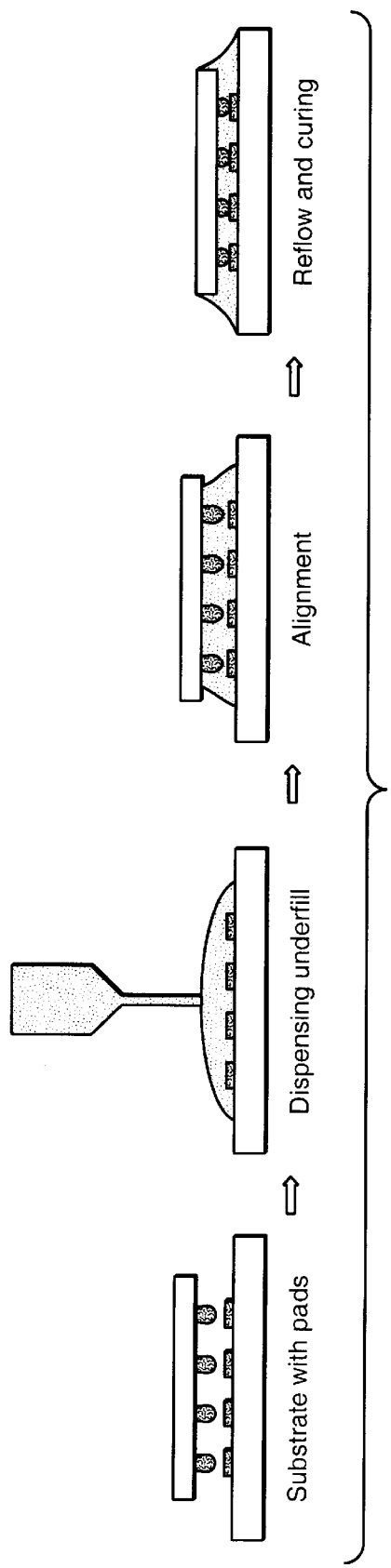
FIG._2 *(PRIOR ART)*

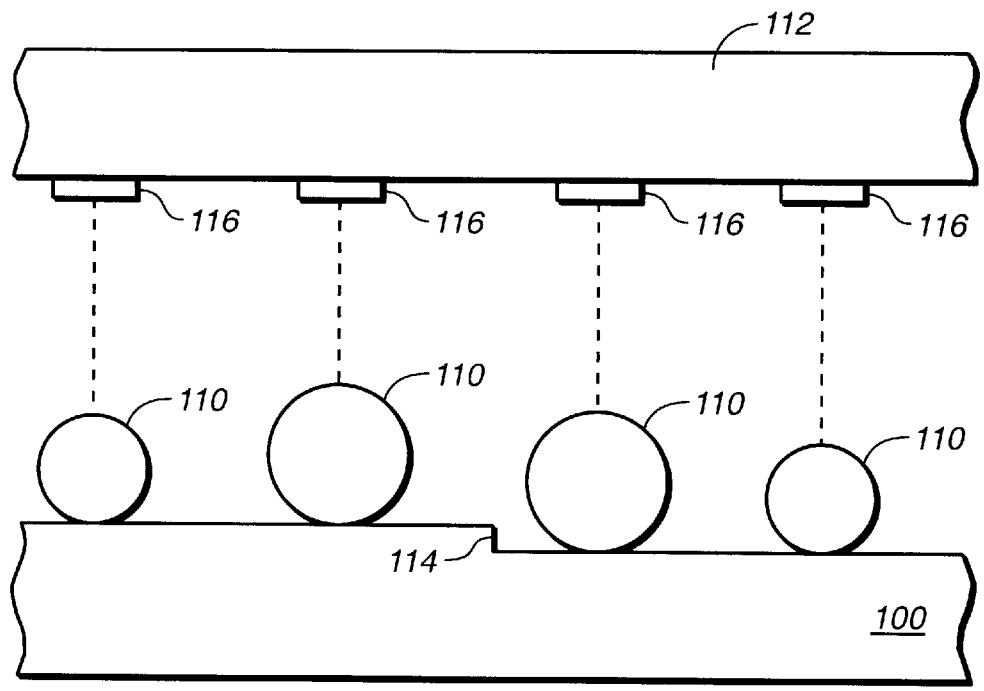
FIG._3
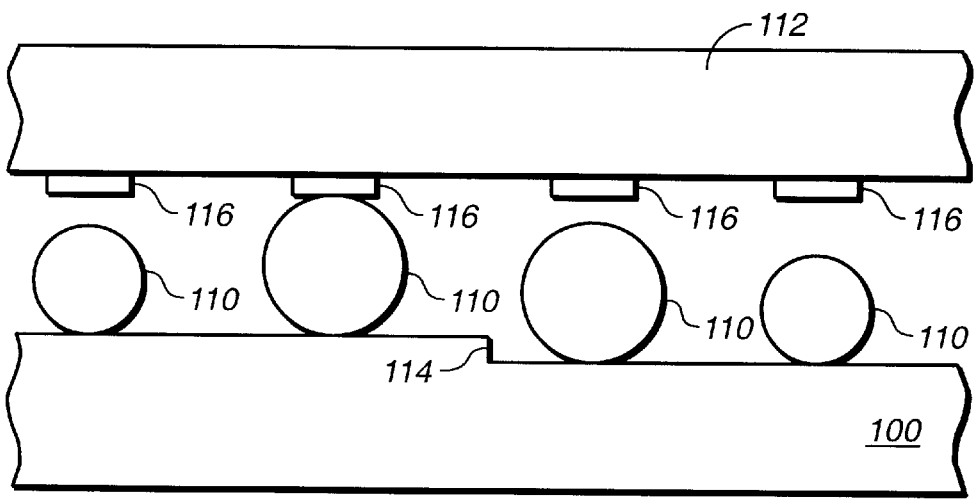
FIG._4

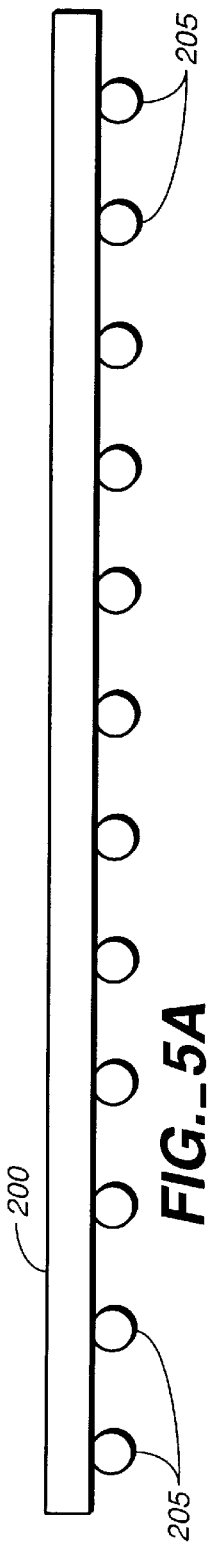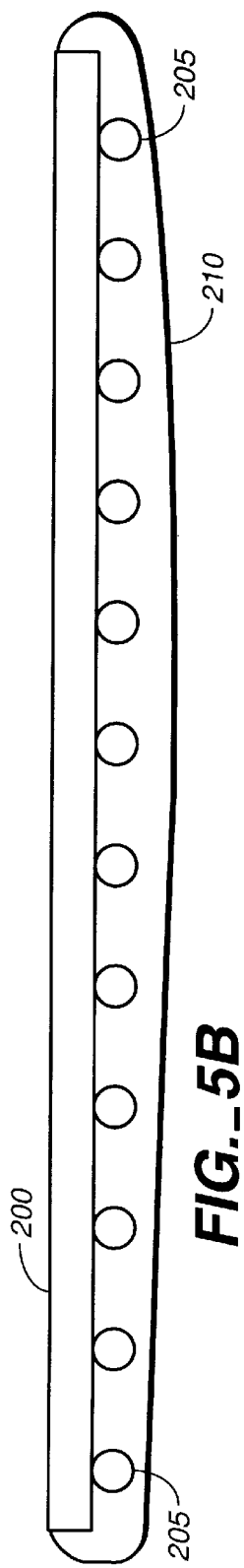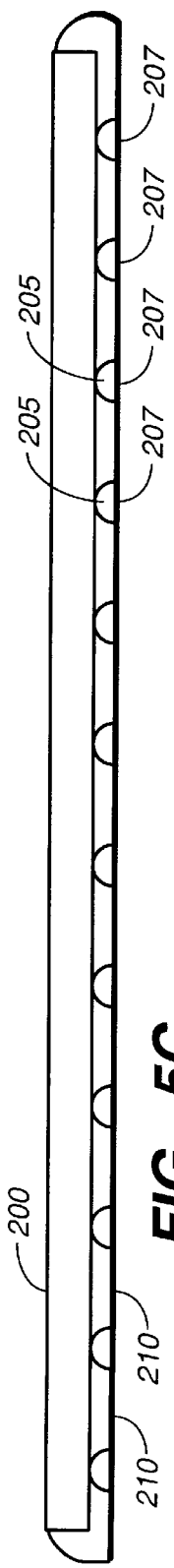

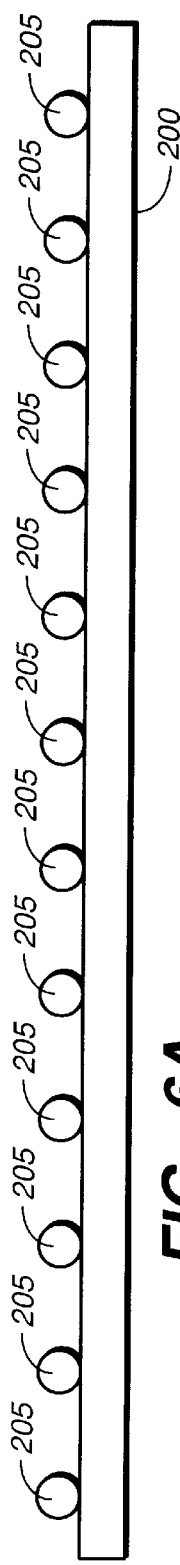
FIG._6A
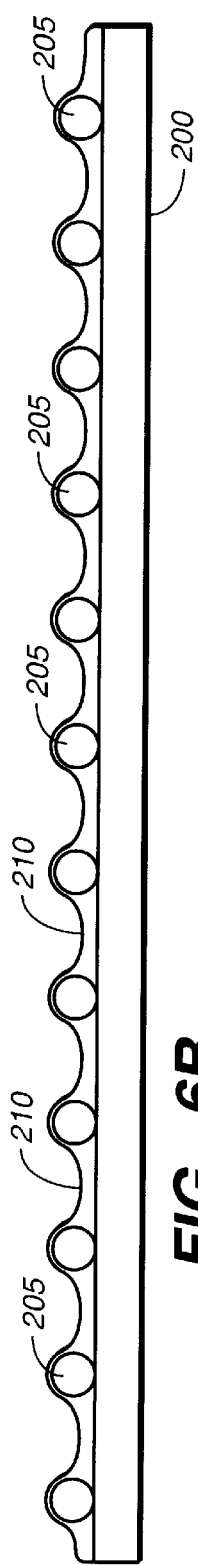
FIG._6B
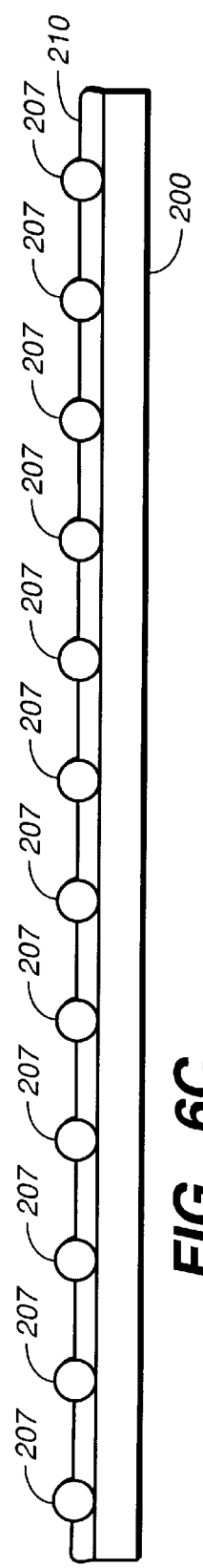
FIG._6C

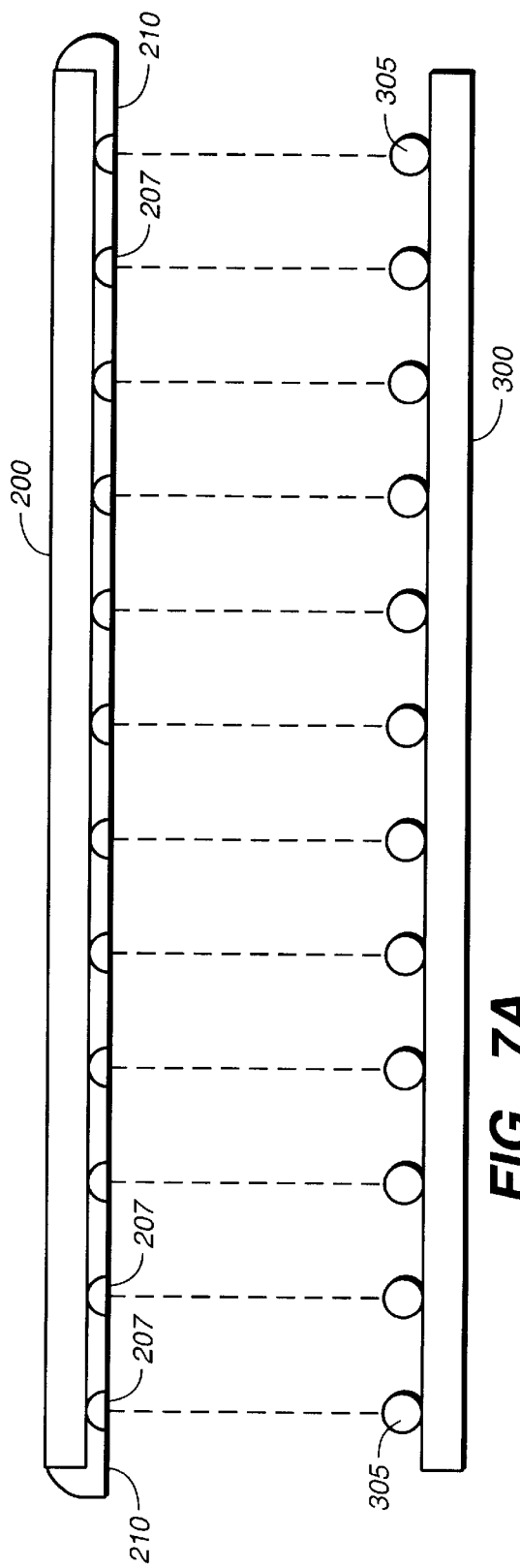
FIG._7A
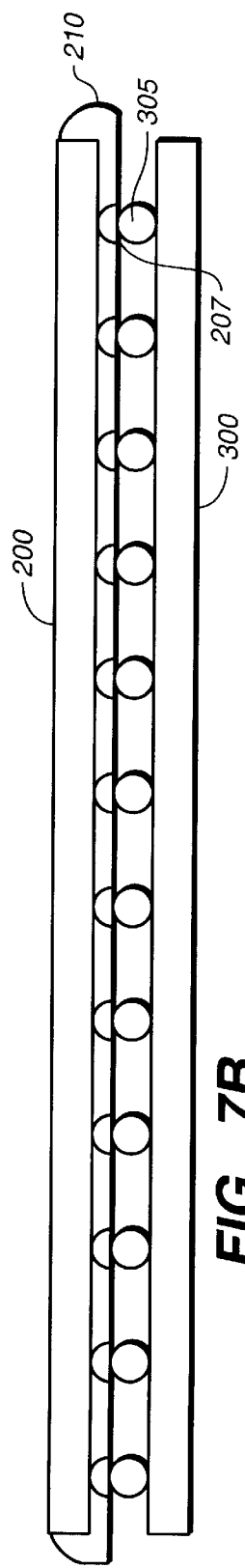
FIG._7B

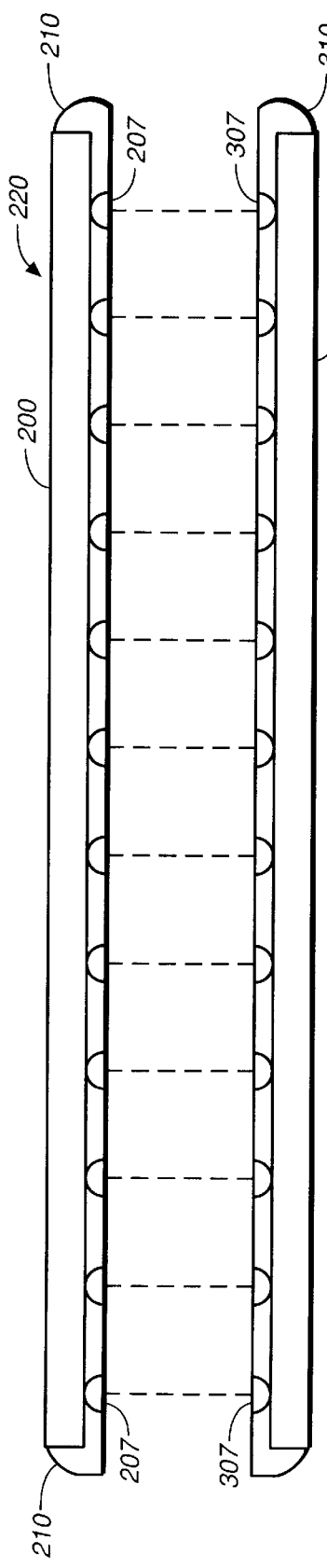
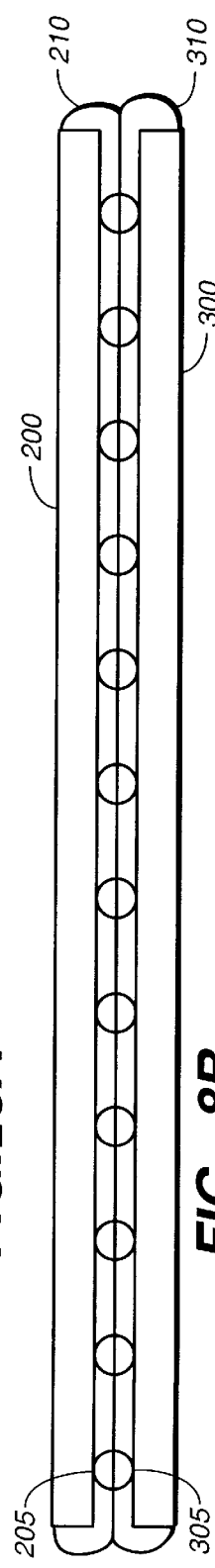
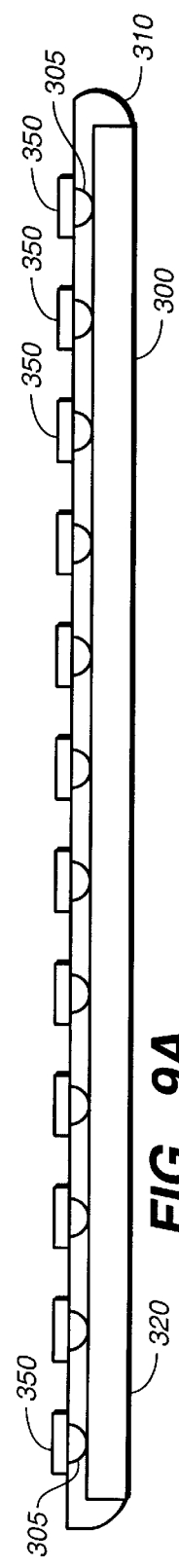
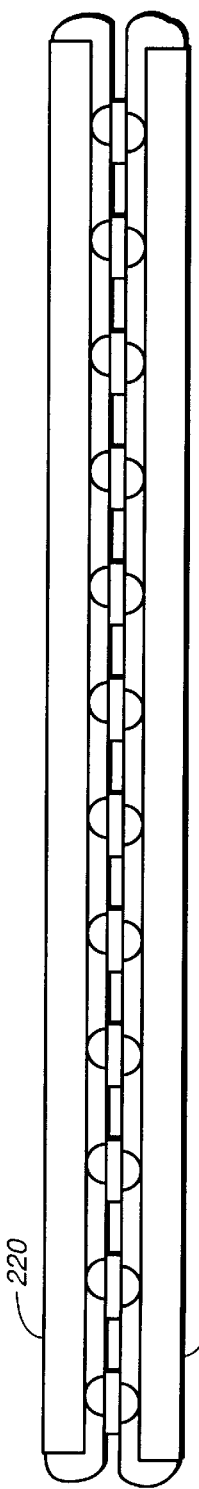
FIG._8A  FIG._8B  FIG._9A  FIG._9B

FLIP CHIP PRE-ASSEMBLY UNDERFILL PROCESS

FIELD OF THE INVENTION

This invention is generally related to the field of semiconductor device packaging, and more particularly to underfilling processes for flip chip bonding a chip to a substrate.

BACKGROUND OF THE INVENTION

Flip chip bonding is a technique is which connections are made between a semiconductor chip and a header. Typically, bead-like projections (conductive bumps) are deposited as terminals on one face of the chip, which are then registered and bonded with header terminals disposed on a substrate module. The substrate module is commonly comprised of a ceramic material, although there is increasing interest in substrates comprised of other materials, such as plastics.

Flip chip bonding provides many advantages compared with making connections to a ceramic header using wire-bonding techniques. These advantages include a reduction in interconnection lengths; a smaller package footprint; and a lower package profile compared with conventional wire bonding techniques. Additionally, flip chip bonding techniques may permit an increased number of input/output interconnections to a chip. The flip chip bonding technique has the potential to provide connections distributed throughout the entire area of a chip with the potential number of connections for a fixed chip size being primarily limited by how densely separate solder connections can be reliably made to contact pads on the chip. In contrast, the number of input/output connections possible with conventional wire bonding is limited by how closely wire bonds can be made along the periphery of a chip.

One common flip-chip bonding technique is termed the "ball grid array" mounting technique, in which a pattern of closely positioned solder balls are used to provide a flip-chip connection between the chip and a ceramic substrate module. However a major concern with the ball grid array package is solder joint reliability.

As is well known in mechanical engineering, a statically determinate member (one that is free to move) comprised of a homogenous isotropic material experiences a differential increase in length as a result of a differential increase in temperature in accordance with the mathematical relationship: $\delta_T = \alpha \Delta TL$, where $\delta_T$ is the differential increase in length of the member, $\alpha$ is the linear coefficient of thermal expansion, $\Delta T$ is the differential change in temperature of the member, and L is the original length of the member. However, a statically indeterminate member whose thermal displacements are constrained, does not change in length but instead becomes thermally stressed. It is well known that when two materials having a large mismatch between their thermal coefficients of expansion (TCE) are rigidly joined together, stresses and strains may develop in the combined structure.

This is important because there is a substantial difference in the TCE of various components of a flip-chip bonding process. For example, the TCE of a semiconductor chip is typically 2.5 parts per million per degree Celsius (ppm/°C.). The TCE of a ceramic substrate module is typically in the range of 10–30 ppm/°C. Although the TCE of common solders varies somewhat with solder composition, common solder materials have a TCE in the range of about 20–25 ppm/°C.

The large difference in TCE between the different components may cause substantial thermal stress. For example, an unattached ceramic module with a TCE of 25 ppm/°C. and a length of 2 centimeter (cm) would expand by 30 microns for a 60° C. temperature rise. By way of comparison, an unattached chip would expand by only 3 microns over the same temperature rise. However, the chip is commonly bonded to the module by solder balls, which are substantially inflexible. Consequently, thermal stresses tend to develop at the solder joints. The thermal stresses may reduce, the reliability of the solder connection. In particular, the lifetime of the solder connections may be substantially reduced as a consequence of variations in stress/strain caused by thermal cycling during normal chip operation.

A solder joint that is repetitively thermally cycled may eventually fail from the cumulative effects of multiple thermal cycles. Fatigue lifetime is commonly defined as the lifetime associated with the number of applied repeated stress cycles a material can endure before failure. Generally, the fatigue lifetime of solder joints decreases with increasing thermal stress on the solder joints during each thermal cycle. Thus, the fatigue lifetime will tend to decrease as the chip size is increased and/or the temperature swing increases, because these factors increase the thermal stresses. Fatigue lifetime tends to increase somewhat when comparatively soft solder joints are utilized. A comparatively soft solder, such as a 95% lead/5% tin solder, permits some limited flexure of the solder joint, which reduces thermal stresses at the solder joints compared with a hard, inflexible solder joint. However, even with comparatively soft solder connections, the solder joints are substantially inflexible. Large thermal stresses will tend to occur at solder joints near the edges of the chip. Consequently, the fatigue lifetime may not be as large as desired, particularly if the chip has a comparatively large area and is thermally cycled over a large temperature range.

One technique to improve the fatigue lifetime of the solder connections in a flip-chip bonding process is the use of a low stress epoxy underfill encapsulant. An epoxy underfill encapsulant substantially fills in the voids between the surfaces of the chip and module around the solder ball connections. An underfill encapsulant can redistribute stresses and strains over the entire chip area rather than having the stresses and strains concentrated near the corner solder joints of the chip. Additionally, the thermal coefficient of expansion (TCE) of the underfill encapsulant may be substantially matched to that of the solder, which reduces thermal stresses/strains at the solder joints. An underfill encapsulant also offers other potential advantages, such as protecting the chip from moisture, mechanical pull, mechanical shear, and shock/vibration.

There are two main processes which are commonly used to underfill a flip-chip bonded wafer. FIG. 1 shows the steps of a liquid flow encapsulation process utilizing capillary action to flow a liquid encapsulant into the gaps between scolder joints of a chip mounted on a substrate. The package is then heat treated to cure the encapsulant. However, an underfilling process utilizing capillary action imposes limitations on the viscosity of the liquid encapsulant and the methods to flow/inject encapsulant into the voids. In particular, the processing conditions must be selected to minimize the possibility that deleterious voids are formed. An underfill process that results in voids in the encapsulation is undesirable because the voids may prevent the encapsulation from effectively redistributing thermal stresses. There are also significant manufacturing problems associated with a liquid underfilling process using capillary action. One disadvantage is that a process utilizing capillary action can require up to twenty to thirty minutes to ensure that the liquid encapsulant has sufficient time to properly flow, which is inconsistent with a high through-put process. Another disadvantage is that there are limitations on the types of materials that can be used as the encapsulant. For example, materials with a comparatively high viscosity or which significantly shrink during curing may be unsuitable encapsulants for a liquid flow encapsulation process because these liquid encapsulant properties increase the possibility of the formation of deleterious voids. For examples a viscous liquid encapsulant has a high resistance to fluid flow, which increases the possibility of creating a void whereas an encapsulant that significantly shrinks during curing may expand the size of voids, exacerbating the problem of void formation.

Another commonly used underfilling process is the so-called "no-flow" encapsulation process. FIG. 2 shows the steps of a no-flow encapsulation process. In a no-flow encapsulation process, a thin layer of soft underfilling material, typically a thick liquid epoxy, is first deposited on the substrate, coating contact pad regions previously patterned on the substrate. Solder balls are patterned on contact pad regions on a chip. The chip is then pressed onto the substrate until the solder balls on the chip press onto the contact pads of the substrate. A subsequent heating process results in the reflowing of solder balls to form solder joints along with the curing of the underfill epoxy around the solder connections. Typically, the heating process is selected so that the solder balls reflow at a first temperature and an extended curing process is conducted at a second temperature.

However, there are several drawbacks with this approach. One problem is that there are limitations on the type of underfilling material that can be used. The underfilling material has to have its curing properties selected so that the right amount of curing takes place after the solder is heated to reflow temperatures. Moreover, the underfilling material should not excessively shrink upon curing, since this could deleteriously affect the solder joints, which are close to, or above, the solder reflow temperature at common curing temperatures. Another problem is that the yield of solder connections may be lower than desired. Solder balls on the chip must push completely through the underfill in order to successfully mate with corresponding bonding pads. However, there may be significant variation in solder ball height. For example, a 10% variation in the height of solder balls that are nominally 100 microns in diameter corresponds to a ±10 micron variation in solder ball height. Some of the smaller diameter solder balls may not punch through the epoxy, which may limit the yield of the process. As shown in FIG. 3, there is a statistical variation in the diameter of solder balls 110 disposed on a chip 100. There may also be an intrinsic non-planarity associated with the chip 100 or the substrate 112, although normally it is the substrate that has the greatest non-planarity. This can be illustrated by showing a step change 114 in height in the chip 100 or substrate 112. As shown in FIG. 4, the combination of the variance in the diameter of solder balls 110 with non-planarity 114 in the chip 100 or substrate 112, may cause some of the solder balls 110 not to successfully mate with corresponding bonding pads 116 on substrate 112 when the solder balls attempt to punch through an epoxy layer.

Conventional underfilling techniques are limited in terms of the choices of materials that may be used. Moreover, conventional underfilling processes pose significant yield and reliability problems. Additionally, the so-called "process window", the ability to vary process variables while maintaining an acceptable yield, is not as large as desired. The process window is narrow because only a limited number of materials with comparatively narrow tolerances in terms of their characteristics (e.g., encapsulant viscosity) are consistent with a high-yield process.

What is desired is an underfilling process that permits a wide variety of underfilling materials to be used in a high-yield encapsulation process.

SUMMARY OF THE INVENTION

The present invention generally comprises a method to encapsulate chips that are bonded to a substrate with an array of conductive bumps, such as solder connections. Broadly speaking the present invention is a method of forming an encapsulated array of solder balls on a first sample that may be bonded to contact pads on another sample, comprising the steps of: patterning a set of solder balls onto the first sample; coating the solder balls in a layer of an encapsulation material, where the encapsulation material substantially covers the set of solder balls disposed on the first sample; heating the sample at a sufficient temperature and for a sufficient length of time so that the encapsulation material hardens; and removing a portion of the layer of the encapsulation material to expose a conductive surface portion of each of the encapsulated solder balls.

In one embodiment, a chip is encapsulated using an epoxy. The epoxy is planarized using a chemical mechanical polishing (CMP) process to expose a conductive surface portion of each solder ball. The encapsulated chip may then be directly bonded to an array of solder balls disposed on a substrate by bringing the planarized solder balls on the chip into contact with corresponding solder balls on the substrate and heating the chip and substrate until the solder reflows to form solder joints.

In a second embodiment, the solder balls on a substrate are also similarly encapsulated with epoxy and planarized using CMP. In a preferred embodiment, the epoxy encapsulation material of both the chip and substrate are plagiarized while the epoxy encapsulation material is in a solid, but non-cured b-stage. Subsequent processes to mount the substrate and chip together are preferably selected so that the b-stage epoxy layers adhere to one another during a subsequent curing step.

BRIEF DESCRIPTION OF THE DRAWINGS

FIG. 1 is side view diagram of a prior art liquid encapsulation process in which a liquid encapsulant flows between solder joints as a consequence of capillary action.

FIG. 2 is a side view diagram of a prior art no-flow encapsulation process in which the solder balls push through a soft encapsulant during a combined curing and solder reflow process.

FIG. 3 is a side-view diagram showing the possible variance in solder ball diameter and wafer non-planarity for the no-flow encapsulation process of FIG. 2.

FIG. 4 is a side-view diagram showing how variance in solder ball diameter and wafer non-planarity may reduce the yield of solder joints formed in the no-flow encapsulation process of FIG. 2.

FIG. 5A is a side view diagram of an embodiment of the encapsulation method of the present invention, showing a step in which an array of solder balls is patterned on the surface of a chip.

FIG. 5B is side view diagram of an embodiment of the encapsulation method of the present invention, showing the step of coating the solder balls of FIG. 5A with an encapsulation material.

FIG. 5C is a side view diagram of an embodiment of the encapsulation method of the present invention, showing the step of planarizing the encapsulation material of FIG. 5B using a chemical mechanical polishing process.

FIG. 6A is a side view diagram of a second embodiment of the encapsulation method of the present invention, showing a step in which an array of solder balls is patterned on the surface of a chip.

FIG. 6B is side view diagram of a second embodiment of the encapsulation method of the present invention, showing the step of coating the solder balls of FIG. 6A with an encapsulation material deposited as a thin liquid layer.

FIG. 6C is a side view diagram of an embodiment of the encapsulation method of the present invention, showing the step of exposing the upper surface of the solder balls using an etching process.

FIG. 7A is side view showing an encapsulated chip and a corresponding array of solder balls on a substrate.

FIG. 7B is side view showing the encapsulated chip of FIG. 7A with its solder balls brought into contact with corresponding bonding connections on the substrate.

FIG. 8A is a side view of a preferred embodiment of the present invention showing an encapsulated chip and an encapsulated substrate.

FIG. 8B is side view of the encapsulated chip of FIG. 8A with its solder balls brought into contact with corresponding solder balls on the substrate.

FIG. 9A is a side view of an encapsulated substrate of the present invention with additional solder pads to facilitate solder reflow.

FIG. 9B is a side view of the encapsulated substrate of FIG. 9A brought into contact with a chip.

DETAILED DESCRIPTION OF THE INVENTION

The present invention generally comprises a method to separately encapsulate solder connections on a chip and then to bond the chip to solder connections on a substrate. This results in solder joints that electrically couple contact pads on a chip with corresponding contact pads on a substrate. In a preferred embodiment, the solder connections on the substrate are also encapsulated prior to bonding the chip to the substrate.

The encapsulation method of the present invention is illustrated in FIGS. 5A, 5B, and 5C. As shown in FIG. 5A, a chip 200 has an array of solder balls 205 patterned upon its surface in contact regions. Although the side view of FIG. 5A shows generally cylindrical solder balls 205, the process used to pattern the array of solder balls preferably includes a solder reflow step, or its equivalent, so that each of the solder balls is electrically coupled to a corresponding contact pad on the chip. As shown in FIG. 5B, chip 200 and patterned solder balls 205 are then coated in an encapsulation material 210. The encapsulation material 210 may be any insulating material that passivates the surface of the chip and which is capable of redistributing thermal and mechanical stresses between the solder balls 205. A passivation material, as used in this application, refers to a material that substantially reduces the exposure of solder contacts to moisture or contaminants that might corrode or otherwise reduce the lifetime of the contact due to chemical effects. For example, the encapsulation material could comprise a layer of polyimide. Spin-on polyimides may be cured to form a hard encapsulation layer. Some polyimide materials may thus be used as encapsulation materials.

Most common encapsulation materials require a treatment step to harden the encapsulation material after it is coated on the chip 200. Typically, the process of applying the encapsulation material also includes baking the coated sample in an oven at an elevated temperature (e.g., 80 degrees Celsius to 170 degrees Celsius) for an extended period of time to dry the encapsulation material and/or cause chemical changes in the encapsulation material that result in the encapsulation material forming a hard surface. However, those of ordinary skill in the art are familiar with other methods to harden particular encapsulation materials, such as infrared or ultraviolet radiation treatments.

In a preferred embodiment, the encapsulation material coating the chip 200 is composed of an epoxy. The epoxy preferably has substantially the same thermal coefficient of expansion as the solder comprising solder balls 205 in order to reduce thermal stresses upon the solder joints. The TCE of a solder depends upon it composition, but is typically in the range of about 20–25 ppm/°C. A variety of epoxies are used in the packaging field and their material properties can vary. In particular, it is well known that the composition of an epoxy may be varied so that the epoxy may have a thermal coefficient of expansion that is very close to that of a solder ball 205. Epoxies are sold as liquids. However, some epoxies are sold in the form of solid bonding sheets.

Epoxies have several distinct states, corresponding to the degree to which polymer molecules of the epoxy are cross-linked. The degree to which cross-linking occurs depends upon the catalyst that is used and upon the thermal history of the epoxy. Many epoxies have both a "b-stage" and a completely cured state. The b-stage is a state in which the polymers of the epoxy have partially cross-linked into longer molecular chains but have not cross-linked into a final cured state. The b-stage is a state in which the epoxy has stiffened into a substantially non-pliable solid at room temperature, i.e., a b-stage epoxy is stiff enough that it is not a liquid that readily flows under pressure. However, a b-stage epoxy is typically not as rigid or hard as a cured film of epoxy. Typically the temperature at which the b-stage is formed is significantly less than the temperature at which the polymer in the epoxy cross-links to form a cured epoxy.

A preferred epoxy is the E38 bonding sheet material manufactured by Shin-Etsu, of Tokyo, Japan. Epoxies, such as the E38 bonding sheet material, are baked at a first temperature until they reach the b-stage. However, they may be adhered to other films while in the b-stage. For example, baking a Shin-Etsu E38 epoxy sheet on a polyimide film at 80 degrees Celsius at a pressure of 100 pounds per square inch (PSI) for five minutes results in a b-stage epoxy that is adhered to the polyimide film. The exposed surface of the b-stage epoxy is solid, not sticky. However, the b-stage epoxy may be later joined to other surfaces because the epoxy is not completely cured. Experiments by the inventors indicate that the above-described b-stage E38 epoxy sheet may be joined to a Kapton film by pressing the exposed surface of the epoxy sheet onto a Kapton film and curing the Kapton/epoxy/polyimide structure at a temperature of 170 degrees Celsius and at a pressure of 500 pounds per square inch (PSI) for about sixty minutes. This results in a polyimide film that is attached to a Kapton film by a cured layer of epoxy. Moreover, the inventors have also determined that a b-stage epoxy may be exposed to common processing steps, such as laser etching and plasma processes without significantly diminishing the ability of the b-stage epoxy to be later bonded to other surfaces. Moreover, tack lamination tests by the inventors indicate that a b-stage epoxy may be exposed to heat treatment steps, i.e., thermal processes substantially below the curing temperature, without significantly diminishing the ability of the b-stage epoxy to be later bonded to other surfaces.

The inventors have recognized that an encapsulation material 210 comprised of an epoxy that is applied over solder balls 205 on chip 200 may be heat-treated to either a b-stage or a cured state prior to subsequent processing steps. Heating the epoxy encapsulation material 210 to a cured state has the advantage that the epoxy is substantially rigid and will not significantly change its shape during subsequent high-temperature processing steps (e.g., processing steps conducted at a temperature between about one-hundred and fifty to two-hundred degrees Celsius). However, heating the epoxy encapsulation material 210 to the b-stage has the advantage that the encapsulation material may later form an epoxy bond with other surfaces, which may assist a chip 200 to be mounted to a substrate.

As shown in FIG. 5C, the encapsulated chip 200 and solder balls 205 are then processed to expose a conductive surface portion 207 of each of the solder balls 205. A preferred method to reveal the surface of the encapsulated solder balls 205 is to planarize the encapsulated chip using a chemical mechanical polishing (CMP) process. A CMP planarization process uses a polishing pad wetted with a slurry that is both chemically reactive and which contains abrasive particles, such as silica or alumina. CMP planarization processes are commonly used to planarize silicon dioxide layers on a silicon wafer.

The inventors have recognized that CMP polishing techniques may be utilized to planarize a variety of encapsulation materials. In particular, a b-stage epoxy is stiff enough (i.e., is substantially non-pliable and does not flow under typical CMP polishing pressures) so that it may be polished using a CMP process. Moreover, CMP planarization processes have evolved to the point where a wafer having regions disposed on its surface with different hardnesses may be simultaneously polished to a common plane. In modem CMP processes two or more different types of materials may be polished simultaneously to a common plane. For example, a CMP planarization process developed by the inventors for polishing a wafer with both copper regions and polyimide regions utilizes a conventional CMP polisher at a platen rotation rate of 60 RPM, a wafer carrier rotation of 60 RPM, a pressure of 3.5 PSI, and a silica or alumina based CMP slurry. Those of ordinary skill in the art of CMP are familiar with the tradeoffs in polishing parameters that facilitate polishing dissimilar materials to a common plane. Additionally, a variety of cleaning methods permit a surface that has been planarized by CMP to be effectively cleansed of CMP residues. For example, a post-CMP cleaning process preferred by the inventors comprises cleaning a polished wafer in a 0.75% ammonia ($NH_4OH$) solution followed by high pressure water cleaning, megasonic cleaning, and brushing the wafer with a polyvinyl (PVA) brush and water. However, since the present invention encompasses a variety of solder types and encapsulation materials, the above-described CMP process may need to be adjusted for particular solder compositions and encapsulation material. An additional chemical or plasma cleaning step may also be used to clean the surface prior to subsequent processing steps.

A planarization process has the benefit that problems associated with variations in solder ball height are eliminated by the planarization process. Moreover, a planar surface is desirable to uniformly transmit stresses from solder balls 205 across the chip 200 through planarized encapsulation material 210. However, while a CMP planarization process is a preferred technique to expose conductive surface portions 207 of encapsulated solder balls 205 on chip 210, other processes may also be used. As shown in FIGS. 6A, 6B, and 6C, other etching processes, such as plasma or chemical etching process, may also be used to expose encapsulated solder balls. FIG. 6A shows an array of solder balls 205 patterned on a chip 200. As indicated in FIG. 6B, a thin layer of an encapsulation material 210 may remain over solder balls 205 on chip 200 after the encapsulation process. This is likely to occur if the epoxy is applied as a comparatively thin layer of a liquid. As indicated in FIG. 6C, the encapsulation material 210 may then be etched down to reveal about one-half of each solder ball, thus exposing a conductive surface portion 207 of each solder ball.

The encapsulated chip may be mounted to a substrate in several ways. In one approach, as shown in the embodiments of FIGS. 6 and 7, the encapsulated chip is mounted onto a substrate patterned with corresponding solder balls. Solder balls are patterned onto contact pad regions of a substrate. Encapsulated solder balls 205 on chip 200 are first brought into physical contact with unencapsulated solder balls 305 on substrate 300. After the solder balls 305 are heated to a reflow temperature, the solder balls 205 on chip 200 will flow together with solder balls 305 to form a common solder joint. Preferably an eutectic or high lead solder is used to facilitate solder reflow. If required, well-known processes may be used to prepare the surface of solder balls 200, 205 prior to bringing the chip 200 and substrate 300 together. For example, a flux or an ink comprising a solder, flux, and epoxy may be patterned onto exposed portions 207 of solder balls 205 on chip 200 to facilitate solder reflow between solder balls 205, 305. Other techniques to clean oxides from the surface of a solder ball, such as plasma assisted dry soldering, may also be used to facilitate solder reflow. For example, plasma assisted dry soldering processes use a flourine $F_2$ plasma to convert a surface tin oxide, $S_nO$, into $S_nOF$, which eliminates the need for conventional solder flux. An alternate process that eliminates the need for solder reflow entirely is to utilize conductive bumps comprised of regions of conductive epoxy instead of substrate solder balls 305. Utilizing a patterned conductive epoxy to electrically couple chip solder balls 205 to the substrate, may however, result in a slightly higher electrical resistance compared with utilizing solder balls 305 to electrically couple chip solder balls 205 to the substrate.

The embodiments of FIGS. 6 and 7 have the advantage of a comparatively simple fabrication process. The encapsulation material 210 redistributes stresses from solder joints across the entire chip, enhancing solder joint fatigue lifetime. Moreover, the solder joint at the chip 200 interface is passivated. A wide variety of encapsulation materials 210 may be used. Thus, the embodiment of FIG. 7 achieves most of the same benefits as conventional underfilling processes while permitting a wider variety of encapsulation materials to be used.

While the embodiment of FIGS. 6 and 7 are useful mounting methods, it may be desirable in some cases to also redistribute stresses on the solder joints at the substrate interface. The fatigue lifetime of solder joints depends upon the solder joint forming a reliable connection to both the chip and the substrate. Consequently, it is preferable to also encapsulate the solder balls 305 disposed on the substrate, even though this requires additional processing steps.

In a preferred embodiment, both the chip and the substrate have encapsulated solder connections. As shown in FIGS. 8A, solder balls 305 disposed on substrate 300 may also be encapsulated and planarized using similar processes as those used to encapsulate and process chip 200. Solder balls 305 are patterned onto contact pad regions of a substrate 300. Preferably, the patterning process includes a reflow step, or its equivalent, which electrically and mechanically couples the solder balls 305 to contact regions on the substrate 300. As shown in FIG. 8B, an encapsulated chip 220 and encapsulated substrate 320 may then have corresponding conductive surface portions 207, 307 of solder balls 205, 305 brought together and heated until the solder balls 205, 305 flow together to form solder joints.

In the embodiment shown in FIGS. 8A and 8B, both the chip 200 and substrate 300 are planarized. This is preferable in terms of the uniform redistribution of stress. However, more generally, either chip 200 or substrate 300 may be processed similar to the embodiment of FIG. 7, i.e., chemically or plasma etched to expose about one-half of a solder ball.

It is desirable that the encapsulation materials 210, 310 on the chip and substrate are bonded together over a substantial surface area in order to facilitate mechanical rigidity of the mounted assembly and a more uniform distribution of stress across the assembled module. For the case of an encapsulation material 210, 310 comprised of an epoxy, the epoxy is preferably heat-treated to a b-stage prior to bringing the chip 200 and substrate 300 into contact with one another. Consequently, the two planarized b-stage epoxy encapsulation materials 210, 310 are bonded together by applying pressure between the chip 200 and substrate 300 as the epoxy is heated to its curing temperature. The curing temperature of common epoxies is about 170 degrees Celsius, although it depends upon the particular chemistry of the epoxy and the catalyst that is used. The solder reflow temperature also depends upon the particular solder that is used, although it is typically in excess of 170 degrees Celsius. Preferably, the time-temperature of the chip/substrate module is ramped up at a sufficient temperature and for a sufficient time so that the solder reflows to form the solder joint and the epoxy cures. For example, with a solder reflow temperature of 200 degrees Celsius and an epoxy curing temperature of 170 degrees Celsius, the temperature may be initially ramped up to 200 degrees Celsius to reflow the solder then lowered to 170 degrees for an extended period of time to cure the epoxy. However, the preferred time-temperature process to reflow the solder and cure the epoxy will depend upon the material properties of both the epoxy and the solder. As is well known, the reflow temperature depends upon the concentration of lead and tin in the solder. A eutectic solder or a solder with a high tin content may be preferable to facilitate solder reflow. Among the factors that will determine a preferred time-temperature process are reflow temperature, the epoxy curing temperature, and the relative thermal expansion of the solder and the epoxy.

It is desirable that a variety of solder and epoxy compositions may be used, since this permits combinations of solder and epoxy compositions to be used that may potentially improve yield, improve device lifetime, and/or reduce fabrication costs. As is well known in the field of packaging, the ability of a solder to reflow depends upon the composition of the solder, the temperature of the reflow process, and whether or not a significant area of liquid solder makes physical contact to another contact area. As shown in FIG. 9A, an additional solder layer 350 may be patterned onto the solder balls 205, 305 on the chip 200 or substrate 300. The solder layer 350 may facilitate an electrical connection between solder balls 205, 305. For example, a thin solder layer 350 on the order of a few thousand Angstroms in thickness composed of solder and/or flux may be screen printed over solder balls 305 to facilitate reflow of solder ball, 205, 305 when encapsulated chip 220 is mated to encapsulated substrate 320. A variety of liquid preparations, commonly known as "inks," may be applied in selected regions of a wafer to foster solder flow. An ink may be stenciled or screen printed onto selected areas. For example a thin layer 350 of an ink containing tin, lead, copper, epoxy, and an organic flux agent may patterned on planarized solder balls 305 to facilitate solder reflow. The use of an additional solder layer 350 may be desirable in some cases to promote wetting and solder reflow between solder balls 205, 305 and/or facilitate using a wider variety of solder compositions in solder balls 205, 305.

Although epoxy encapsulation materials are a preferred encapsulation material, other materials have properties that may permit a planarized chip 200 and substrate 300 to be bonded together. For example, some polyimide materials may be soft-baked (e.g., at a temperature less than about ninety degrees Celsius) and then later solvent treated to render their surfaces comparatively soft and sticky. Two solvent-treated polyimide surfaces may then be bonded together under heat and pressure. Generally, there are a variety of materials that may be coated and processed to encapsulate solder balls 205, 305 and then chemically treated to render the surfaces capable of being bonded to a similarly treated surface. Moreover, additional adhesive or epoxy layers may be patterned onto a planarized encapsulation layer. For example, a patterned conductive epoxy disposed between solder balls 205, 305 may have sufficient conductivity to electrically couple solder balls 205, 305 disposed an encapsulated chip 220 and substrate 320 without a reflow step. Moreover, in some cases the adhesion of a patterned conductive epoxy may be sufficient to bond an encapsulated chip 220 and substrate 320 together.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A method of forming an encapsulated array of solder bumps on a chip, the method comprising:
   (a) patterning a set of solder bumps onto said chip;
   (b) coating said solder bumps in a layer of an encapsulation material, said encapsulation material substantially covering said set of solder bumps on said chip;
   (c) heating said encapsulation material at a sufficient temperature and for a sufficient length of time that said encapsulation material stiffens to a substantially non-pliable solid; and
   (d) removing a portion of said layer of said encapsulation material to expose a conductive portion of each of said encapsulated solder bumps while the encapsulation material is on the chip.

2. A method of forming an encapsulated array of solder bumps on a first sample that may be bonded to another sample, the method comprising:
   (a) patterning a set of solder bumps onto said first sample;
   (b) coating said solder bumps in a layer of an encapsulation material comprising an epoxy material, said encapsulation material substantially covering said set of solder bumps on said first sample;

(c) heating said encapsulation material at a sufficient temperature and for a sufficient length of time that said encapsulation material stiffens to a substantially non-pliable solid which is hardened to a b-stage; and (d) removing a portion of said layer of said b-stage encapsulation material to expose a conductive portion of each of said encapsulated solder bumps.

3. The method of claim 2, wherein said step (d) of removing a portion of the encapsulation material is performed by a chemical mechanical polishing process.

4. The method of claim 3, wherein said chemical mechanical polishing process removes about one half of each of said encapsulated solder bumps.

5. The method of claim 4, further comprising:
patterning solder pads on the polished surface of said chemically mechanically polished solder bumps.

6. The method of claim 5, wherein said patterned solder pads are formed using a solder ink.

7. The method of claim 5, wherein said solder pads are in the form of a deposited layer of solder.

8. The method of claim 2, wherein the solder bumps are solder balls.

9. A method of forming encapsulated solder joints in an array of solder joints formed between a chip and a substrate, comprising the steps of:

(a) patterning a first set of solder balls onto a first set of contact regions of the chip;

(b) coating the chip with a chip encapsulation material, said chip encapsulation material substantially covering said first set of solder balls disposed on said chip;

(c) removing a portion of said chip encapsulation material to expose a conductive surface portion of each of said first set of solder balls;

(d) patterning a second set of solder balls onto a second set of contact regions on the substrate;

(e) bringing said first set of solder balls on said chip into contact with said second set of solder balls on said substrate; and (f) heating said chip and said substrate at a sufficient temperature for said first and second set of solder balls to reflow into solder joints.

10. The method of claim 9, wherein step (c) for removing a portion of the chip encapsulation material comprises the step of: planarizing the encapsulated chip by using a chemical mechanical polishing process to polish the encapsulated chip to a common plane extending through a portion of said first set of solder balls.

11. The method of claim 10, further comprising the steps of:
coating the substrate with a substrate encapsulation material, said substrate encapsulation material substantially covering said second set of solder balls disposed on said substrate; and
removing a portion of said substrate encapsulation material to expose a conductive portion of each said second set of solder balls.

12. The method of claim 11, wherein said step for removing a portion of said substrate encapsulation material comprises the step of planarizing the encapsulated substrate by chemical mechanical polishing the encapsulated substrate to a common plane extending through a portion of said first set of solder balls.

13. The method of claim 12, wherein said substrate encapsulation material and said chip encapsulation material are composed of an epoxy that is heated to the b-stage and wherein the step (f) of heating said chip and said substrate is conducted at a sufficient temperature and with a sufficient pressure between said chip and said substrate so that said epoxy encapsulation layers are bonded together.

14. The method of claim 12, further including the step of patterning a solder pad over each said planarized second set of solder balls after said second set of solder balls are planarized.

15. A method of bonding a chip to a substrate, comprising the steps of:

(a) patterning a first set of solder balls onto a set of contact regions of the chip;

(b) coating the chip with a first layer of epoxy, said epoxy substantially covering said first set of solder balls disposed on said chip;

(c) heating said chip at a sufficient temperature for a sufficient time to convert said first layer of epoxy into a b-stage epoxy;

(d) planarizing said first layer of epoxy to reveal an exposed conductive surface portion of each said first set of solder balls;

(e) patterning a second set of solder balls onto a second set of contact regions on the substrate;

(f) coating the substrate with a second layer of epoxy, said epoxy substantially covering said second set of solder balls disposed on said substrate;

(g) heating said substrate at a sufficient temperature for a sufficient time to convert said second layer of epoxy into a b-stage epoxy;

(h) planarizing said second layer of epoxy to reveal a conductive surface portion of each said second set of solder balls;

(i) bringing said first set of solder balls on said chip into contact with said second set of solder balls on said substrate; and (j) applying a sufficient pressure between said chip and said substrate at a sufficient temperature and for a sufficient time to bond said first layer of epoxy to said second layer of epoxy and reflowing said solder balls into solder joints.

16. The method of claim 15, further comprising the step of patterning a solder ink composed of flux, epoxy, and solder over one of said set of solder balls prior to the step of bring said solder balls on said chip and said substrate into contact with each other.

17. The method of claim 15, further comprising the step of patterning solder pads on said first or second set of solder balls after one said step of planarizing said surface.

18. The method of claim 15, further comprising the step of cleaning the surface of said epoxy layers prior to said step of bringing said solder balls on said chip and said substrate into contact.

19. The method of claim 18, wherein said cleaning step includes plasma etching.

20. The method of claim 19, wherein said cleaning step includes chemical etching.

* * * * *